United States Patent
Bovington et al.

(10) Patent No.: US 10,014,659 B2
(45) Date of Patent: Jul. 3, 2018

(54) LASER ARRAY WITH DISTRIBUTED BRAGG REFLECTORS

(71) Applicant: Oracle International Corporation, Redwood Shores, CA (US)

(72) Inventors: Jock Bovington, San Diego, CA (US); Xuezhe Zheng, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 260 days.

(21) Appl. No.: 15/183,559

(22) Filed: Jun. 15, 2016

(65) Prior Publication Data

US 2018/0115139 A1 Apr. 26, 2018

(51) Int. Cl.
*G02B 6/12* (2006.01)
*H01S 5/12* (2006.01)
*H01S 5/125* (2006.01)
*H01S 5/0683* (2006.01)
*H01S 5/00* (2006.01)
*H01S 5/10* (2006.01)

(52) U.S. Cl.
CPC ........ *H01S 5/1215* (2013.01); *G02B 6/12004* (2013.01); *H01S 5/0085* (2013.01); *H01S 5/06837* (2013.01); *H01S 5/1071* (2013.01); *H01S 5/125* (2013.01); *G02B 2006/12121* (2013.01); *G02B 2006/12142* (2013.01)

(58) Field of Classification Search
CPC ........ H01S 5/187; H01S 5/0085; H01S 5/125; H01S 5/068; H01S 5/0683; H01S 5/1074; H01S 5/06837; G02B 6/12004
See application file for complete search history.

(56) References Cited

U.S. PATENT DOCUMENTS

| | | | |
|---|---|---|---|
| 2010/0006784 A1* | 1/2010 | Mack | G02B 6/34 250/551 |
| 2015/0207291 A1* | 7/2015 | Rickman | H01S 5/142 372/20 |

OTHER PUBLICATIONS

A. V. Krishnamoorthy et al: "Exploiting CMOS Manufacturing to Reduce Tuning Requirements for Resonant Exploiting CMOS Manufacturing to Reduce Tuning Requirements for" vol. 3, No. 3, 2011.

(Continued)

*Primary Examiner* — Thomas A Hollweg
*Assistant Examiner* — Mary A El Shammaa
(74) *Attorney, Agent, or Firm* — Park, Vaughan, Fleming & Dowler LLP

(57) ABSTRACT

An optical source is described. This optical source includes a set of semiconductor optical amplifiers, with a semiconductor other than silicon, which provides an optical gain medium. In addition, a photonic chip, optically coupled to the set of semiconductor optical amplifiers, includes optical paths. Each of the optical paths includes an optical waveguide and a distributed-Bragg-reflector (DBR) ring resonator. The DBR ring resonator at least partially reflects a given tunable wavelength in an optical signal provided by a given semiconductor optical amplifier. Moreover, the DBR ring resonator includes a different number of grating periods than DBR ring resonators in the remaining optical paths, and the DBR ring resonators in the optical paths have a common radius.

20 Claims, 5 Drawing Sheets

(56) References Cited

OTHER PUBLICATIONS

S. Tanaka et al: "Four-Wavelength Silicon Hybrid Laser Array with Ring-Resonator Based Mirror for Efficient CWDM Transmitter" Opt. Fiber Commun. Conf. Fiber Opt. Eng. Conf. 2013, p. OTh1D. 3, 2013.
A. Arbabi et al: "Realization of small footprint miroring reflectors" vol. 3, pp. 5-6, 2011.
A Arbabi et al: "Realization of a narrowband single wavelength microring mirror" vol. 091105, No. 2011, 2014.
Y. Mo et al: "A microring resonator with an integrated Bragg grating: a compact replacement for a sampled grating distributed Bragg reflector." No. 2009, pp. 689-697, 2010.
Y. M. Kang et al: "Engineering the spectral reflectance of microring resonators with integrated reflective elements" vol. 18, No. 16, pp. 1420-1426, 2010.
J. H. Lee et al: "High power and widely tunable Si hybrid external-cavity laser for power efficient Si photonics WDM links" Opt. Express, vol. 22, No. 7, pp. 7678-7685, Apr. 2014.

* cited by examiner

LASER ARRAY WITH DISTRIBUTED BRAGG REFLECTORS

GOVERNMENT LICENSE RIGHTS

This invention was made with U.S. government support under Agreement No. HR0011-08-9-0001 awarded by DARPA. The U.S. government has certain rights in the invention.

BACKGROUND

Field

The present disclosure relates to the design of an optical source. More specifically, the present disclosure relates to the design of an optical source that includes a distributed Bragg reflector (DBR) ring resonator in an optical cavity.

Related Art

Silicon photonics is a promising technology that can provide large communication bandwidth, low latency and low power consumption for inter-chip and intra-chip connections or optical links. In order to achieve low-latency, high-bandwidth optical connectivity, a variety of optical components are needed to implement high-speed, multi-wavelength silicon photonic links, including: optical modulators, optical detectors, wavelength multiplexers/demultiplexers and optical sources (such as silicon-assisted external-cavity lasers). These optical components often include a mirror integrated into a silicon optical waveguide.

One approach for implementing an integrated mirror is a distributed Bragg reflector (DBR). While DBRs can select a single wavelength, they have wide bandwidth, which typically makes DBRs a poor choice for long optical cavities because there would be numerous competing optical-cavity modes inside the DBR bandwidth.

Ring-resonator mirrors are often a better choice than DBRs for providing mode-selectivity because of their sharp resonance peaks. However, ring-resonator mirrors have periodic peaks that can occur multiple times within the spectral bandwidth of an optical gain medium, and thus can introduce competing optical modes in an optical source (such as a laser).

Hence, what is needed is a technique for implementing an integrated mirror without the above-described problems.

SUMMARY

One embodiment of the present disclosure provides an optical source that includes a set of semiconductor optical amplifiers, defined in a semiconductor other than silicon, which have a first edge and a second edge. This set of semiconductor optical amplifiers includes a reflective coating on the first edge, and each of the semiconductor optical amplifiers provides a given optical signal having a given carrier wavelength at the second edge. Moreover, the optical source includes a photonic chip, optically coupled to the set of semiconductor optical amplifiers, that includes optical paths. A given optical path includes an optical waveguide, having a third edge optically coupled to the second edge and a fourth edge, that conveys the given optical signal. Moreover, the given optical path includes a distributed-Bragg-reflector (DBR) ring resonator, optically coupled to the optical waveguide proximate to the fourth edge. The DBR ring resonator at least partially reflects a given tunable wavelength in the given optical signal, where the DBR ring resonator includes a different number of grating periods than DBR ring resonators in the remaining optical paths, and the DBR ring resonators in the optical paths have a common radius.

Note that the set of semiconductor optical amplifiers is: edge coupled to the photonic chip; and/or surface-normal coupled to the photonic chip.

Moreover, the given optical path may include an output optical waveguide optically coupled to the optical waveguide between the third edge and the fourth edge.

Furthermore, the optical source may include a combiner that combines optical signals from the optical paths into a common output optical signal having multiple tunable wavelengths.

In some embodiments, the optical source includes: a thermal-tuning mechanism thermally coupled to the DBR ring resonators; and a monitor, optically coupled to the at least one of the optical paths, that measures at least one of the tunable wavelengths; and control logic, electrically coupled to the monitor and the thermal-tuning mechanism, that thermally tunes tunable wavelengths of the DBR ring resonators based on the measurement of at least the one of the tunable wavelengths. Note that the DBR ring resonators may be thermally tuned as a group instead of being individually tuned.

Additionally, grating-waveguide perturbations may fill: 50% of a total circumference of the ring, or 100% of a total circumference of the ring.

Note that adjacent DBR ring resonators may have an integer difference in the number of grating periods.

Moreover, the given optical path may include a phase modulator optically coupled to the optical waveguide.

Furthermore, the photonic chip may include: a substrate; a buried-oxide layer disposed on the substrate; and a semiconductor layer disposed on the buried-oxide layer, where the optical paths and the DBR ring resonators are defined in the semiconductor layer. For example, the substrate, the buried-oxide layer and the semiconductor layer may constitute a silicon-on-insulator technology.

In some embodiments, the control logic monitors the optical power of the DBR ring resonators using the thermal-tuning mechanism.

Another embodiment provides a system that includes: a processor; a memory that stores a program module; and the optical source. During operation, the program module is executed by the processor.

Another embodiment provides a method for providing the optical signals, which may be performed by the optical source.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an optical source (such as a laser, which is sometimes referred to as a 'hybrid external cavity laser'), a system that includes the optical source, and a technique for providing optical signals are described. The optical source includes a set of semiconductor optical amplifiers, with a semiconductor other than silicon, which provides an optical gain medium. In addition, a photonic chip, optically coupled to the set of semiconductor optical amplifiers, includes optical paths. Each of the optical paths includes an optical waveguide and a distributed-Bragg-reflector (DBR) ring resonator. The DBR ring resonator at least partially reflects a given tunable wavelength in an optical signal provided by a given semiconductor optical amplifier. Moreover, the DBR ring resonator includes a different number of grating periods than DBR ring resonators in the remaining optical paths, and the DBR ring resonators in the optical paths have a common radius.

By maintaining the same (i.e., the common) ring radius for each of the DBR ring resonators while changing only the integer number of grating periods in the circumference, an array of lasers with consistent channel spacing (such as 2 nm) may be provided. Moreover, each of the DBR ring resonators provides a single, narrow bandwidth reflection spectrum that can be tuned (e.g., based on measurements at an optical monitor or through port of at least one of the DBR ring resonators) to align this peak with the laser optical-cavity mode in a given optical path. Furthermore, the optical source may have an optional combiner that combines the optical signals from the optical paths into a common output optical signal having multiple tunable wavelengths. In this way, the optical source may be highly integrated (and, thus, compact), high efficiency and low loss (by eliminating unnecessary components and outputs), and may offer design flexibility. Therefore, the optical source can provide a low-cost, compact, energy-efficient optical source for use in inter-chip and intra-chip connections, such as wavelength-division-multiplexing (WDM) silicon-photonic links. Furthermore, the optical source may help facilitate high-speed inter- and intra-chip silicon-photonic interconnects, as well as associated systems that can include this component (such as high-performance computing systems).

Figure 1:
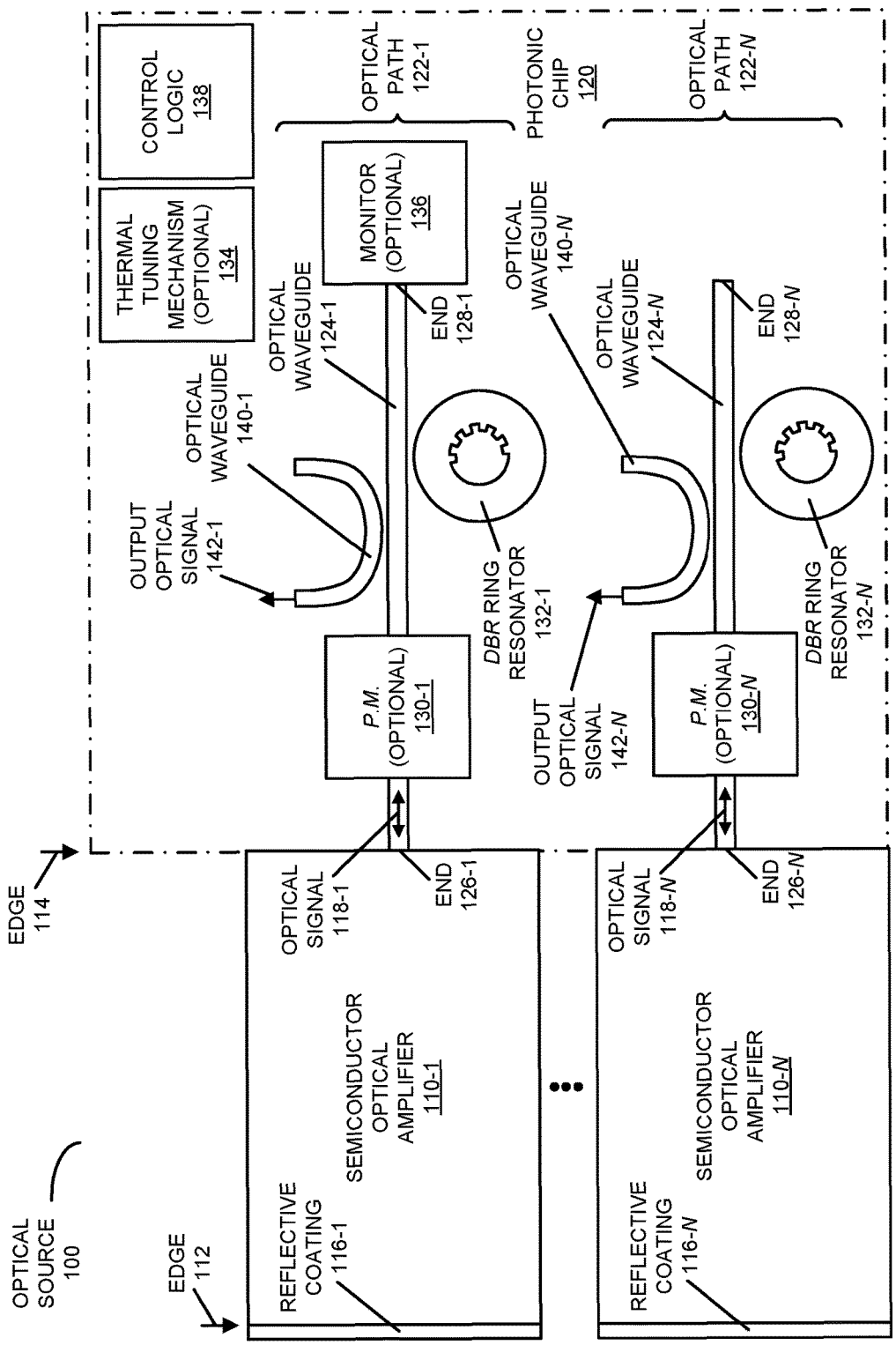
FIG. 1 is a block diagram of a top view of an optical source in accordance with an embodiment of the present disclosure.

We now describe embodiments of the optical source. FIG. 1 presents a block diagram of a top view of an optical source 100. This optical source includes a set of semiconductor optical amplifiers 110, defined in a semiconductor other than silicon, which has edges 112 and 114. For example, the set of semiconductor optical amplifiers 110 may be defined in a semiconductor (such as gallium-arsenide or indium-phosphide), erbium or germanium, which provides an optical gain or active medium. A given semiconductor optical amplifier (such as semiconductor optical amplifier 110-1) includes a reflective coating 116-1 on edge 112 (thus, semiconductor optical amplifier 110-1 may be a reflective semiconductor optical amplifier), and provides an optical signal 118-1 at edge 114. In particular, optical signal 118-1 may have an associated carrier or fundamental wavelength λ (such as 1.3 or 1.55 μm). (However, in some embodiments, a high reflectivity mirror is integrated into the semiconductor instead of using reflective coating 116-1, such as: a strong DBR, a notched mirror, metal layer, etc.). Thus, the set of semiconductor optical amplifiers 110 may provide optical signals having carrier wavelengths.

Moreover, optical source 100 includes a photonic chip 120, optically coupled to the set of semiconductor optical amplifiers 110, which includes multiple optical paths 122. A given optical path (such as optical path 122-1) includes: an optical waveguide 124-1, having end 126-1 optically coupled to edge 114 and end 128-1, that conveys optical signal 118-1; an optional phase modulator (P.M.) 130-1 optically coupled to optical waveguide 124-1, which modulates optical signal 118-1; and a DBR ring resonator 132-1, optically coupled to optical waveguide 124-1 proximate to end 128-1, which at least partially reflects a tunable wavelength in optical signal 118-1 (such as a resonant wavelength of DBR ring resonator 132-1). For example, a gap between optical waveguide 124-1 and DBR ring resonator 132-1 may result in critical optical coupling between optical waveguide 124-1 and DBR ring resonator 132-1. Note that DBR ring resonator 132-1 includes a different number of grating periods than DBR ring resonators 132 in the remaining optical paths, and DBR ring resonators 132 in the optical paths have a common radius.

In an exemplary embodiment, grating-waveguide perturbations fill: 50% of a total circumference of the ring, or 100% of a total circumference of the ring. Note that a 50% fill factor may maximize the multiple resonances of the ring resonator at the FSR of the ring resonator. Moreover, a 100% fill factor may ensure that the effective index of refraction of the ring resonator and the DBR are identical, as they are made in the same element. Furthermore, note that adjacent DBR ring resonators in DBR ring resonators 132 may have an integer difference in the number of grating periods, and the common radius of DBR ring resonators 132 may be associated with or correspond to a free-spectral range equal to or a multiple of the channel spacing.

Additionally, optical source 100 may include: an optional thermal-tuning mechanism 134 (such as a silicon-based resistive heater or a resistive metal heater) thermally coupled to DBR ring resonators 132 (such as over or proximate to DBR ring resonators 132); an optional monitor 136, optically coupled to the at least one of the optical paths, that measures at least one of the tunable wavelengths (e.g., by measuring at least a portion of at least one of the optical signals); and control logic 138 (which may be a circuit implemented in silicon), electrically coupled to optional monitor 136 and the optional thermal-tuning mechanism 134, that thermally tunes tunable wavelengths of DBR ring resonators 132 (and, thus, the lasing wavelengths) based on the measurement of at least the one of the tunable wavelengths. Note that DBR ring resonators 132 may be thermally tuned as a group instead of being individually tuned.

For example, control logic 138 may implement a wavelength-based feedback loop based on an optional monitor 136. In particular, optional monitor 136 may measure at least the tunable wavelength (or, equivalently, a given carrier wavelength). Alternatively, optical source 100 may include an interface (not shown) that receives wavelength-feedback information from an optional external wavelength sensor (not shown).

In some embodiments, control logic 138 monitors the optical power of DBR ring resonators 132 using thermal-tuning mechanism 134. In particular, a silicon resistive heater (such as a P-I-P heater) that is used to tune a ring resonator may be used to monitor the ring resonator by detecting a change in resistance as a function of the increase in optical power in the ring resonator while it is on resonance. This approach may be useful for this type of mirror if there is only an input and an output optical waveguide and no monitor port (as described further below with reference to FIG. 2). Thus, thermal-tuning mechanism 134 may provide a photon-conductive monitor and a silicon heater integrated with DBR ring resonators 132, and in the figures should also be understood, in some embodiments, to constitute a tuner/monitor.

Optical source 100 may provide multiple output optical signals 142, which each includes a given carrier wavelength. For example, optical source 100 may include output optical waveguides 140 optically coupled, e.g., by directional couplers, to optical waveguides 124 between ends 126 and 128. In this embodiment, DBR ring resonators 132 may provide near-perfect reflection.

Figure 2:
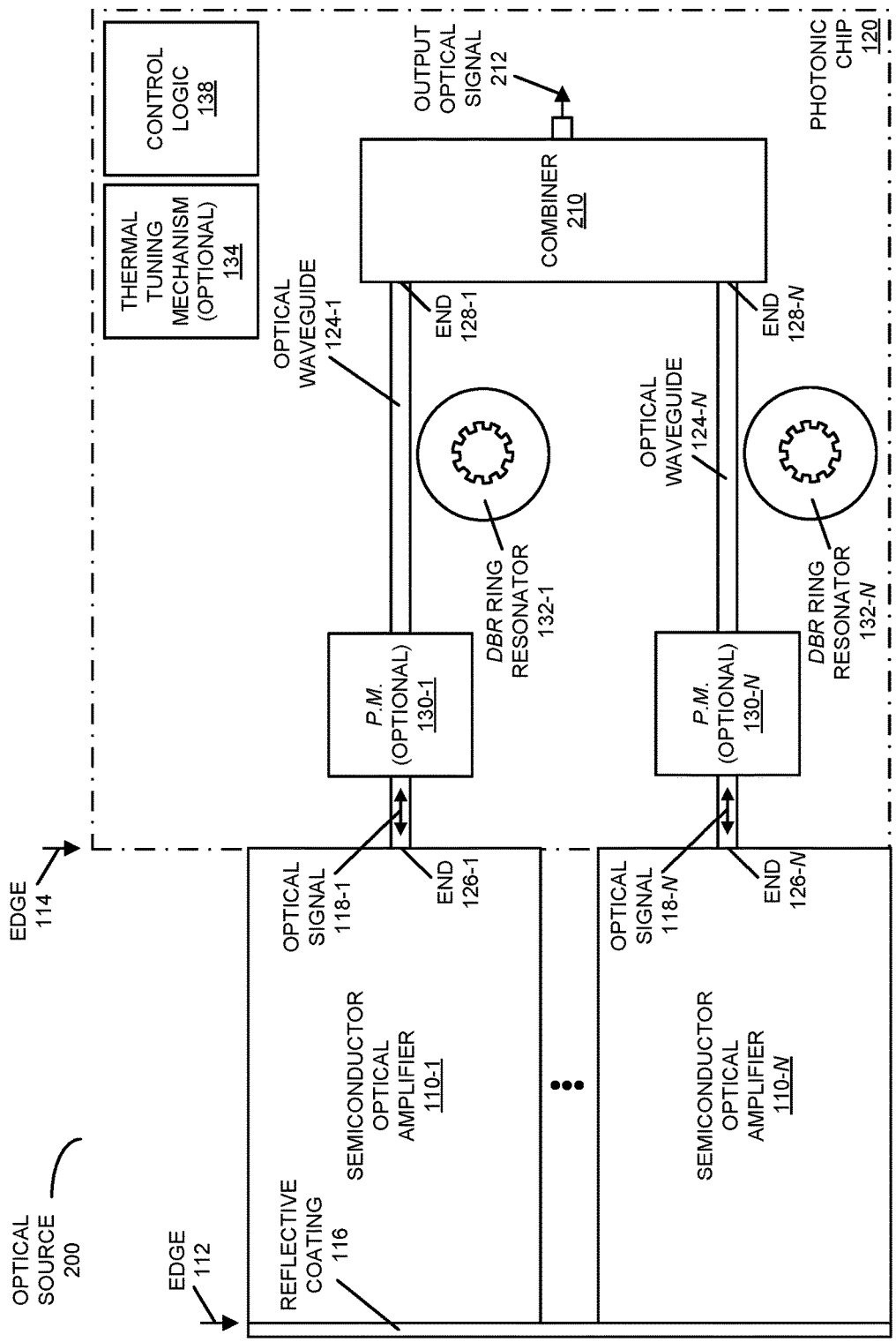
FIG. 2 is a block diagram of a top view of an optical source in accordance with an embodiment of the present disclosure.

Alternatively, in some embodiments the optical source provides an output optical signal that includes multiple carrier wavelengths. This is shown in FIG. 2, which is a block diagram of a top view of an optical source 200. This optical source includes a combiner 210 that combines optical signals 118 from the optical paths into a common output optical signal 212 having multiple tunable wavelengths. In this embodiment, DBR ring resonators 132 may be only partially reflective.

Using a partially reflective design enables the light to exit the single output port. Once again, the common radius of DBR ring resonators 132 may be associated with or correspond to a free-spectral range equal to or a multiple of the channel spacing. The number of teeth in the grating couplers (or, more generally, the periods of perturbation) may increment in an integer fashion (such as 101, 102, 103, etc. or in the case of a larger ring with a free-spectral range that is twice the channel spacing, 100, 102, 104, etc.). More generally, in FIGS. 1 and 2, the number of teeth in the DBR ring resonators may vary from m to m+N, where N is the number of channels. For example, m may be 300 and the period of the DBRs may be 300 nm. The uniformity of the channel spacing may rely on the consistency of the lithography and, as described further below, the semiconductor-layer thickness in photonic chip 120.

Figure 3:
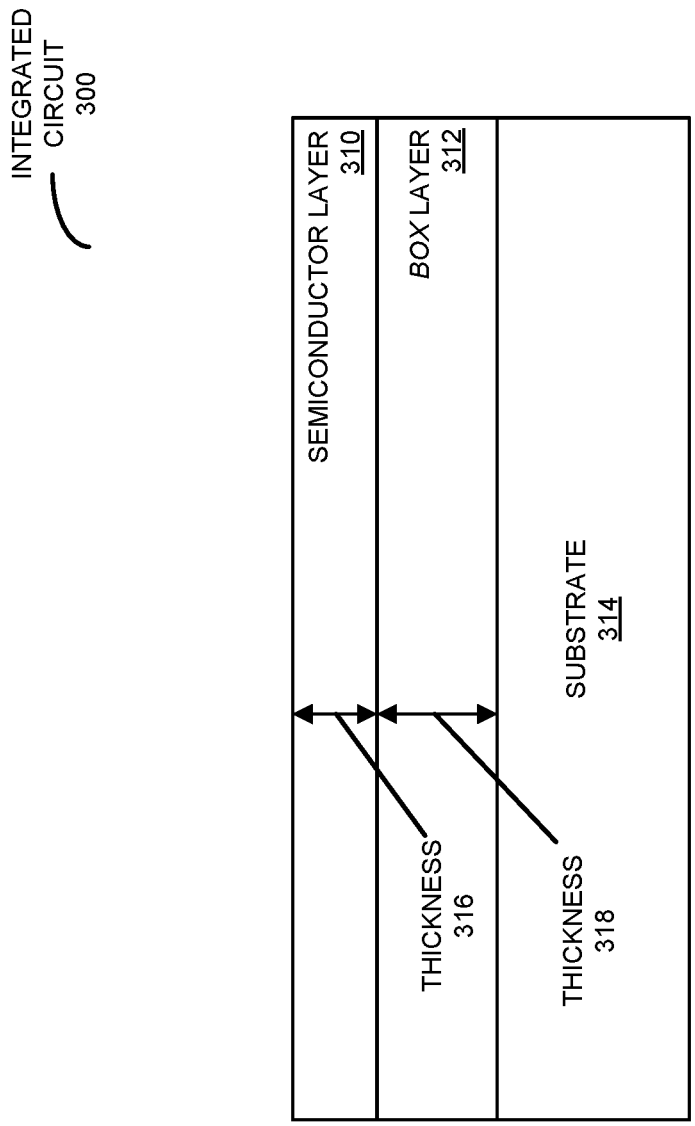
FIG. 3 is a block diagram of a side view of an optical source in accordance with an embodiment of the present disclosure.

The photonic chip may be implemented using a silicon-on-insulator (SOI) technology or platform. This is shown in FIG. 3, which presents a block diagram of a side view of an integrated circuit 300. In this integrated circuit, components in the optical source are implemented, at least in part, in a semiconductor layer 310, such as silicon. Furthermore, semiconductor layer 310 may be disposed on or bonded to a buried-oxide layer 312 (such as silicon-dioxide), which, in turn, is disposed on or grown on a substrate 314 (such as silicon). Note that buried-oxide layer 312 may have a low optical index of refraction so as to provide or offer cladding. Moreover, semiconductor layer 310 may have a high optical index of refraction so as to provide or function as an optical waveguide. However, other materials and/or platforms may be used.

In an exemplary embodiment, optical signals 118 (FIGS. 1 and 2) have wavelengths between 1.1-1.7 µm, such as an optical signal having a fundamental wavelength of 1.3 or 1.55 µm. Moreover, an optical waveguide in semiconductor layer 310 may have a thickness 316 between 0.25 and 3 µm, and width between 0.5 and 3 µm. Note that because the optical waveguide may have a quasi-rectangular cross-section, it may be a quasi-single mode component. Moreover, buried-oxide layer 312 may have a thickness 318 between 0.3 and 3 µm.

Referring back to FIG. 1, the optical coupling of the set of semiconductor optical amplifiers 110 and photonic chip 120 may include: edge coupling (such as facet-to-facet optical coupling), vertical or surface-normal coupling (such as a vertical-angled technique using an angled-facet output on the set of semiconductor optical amplifiers 110, and grating couplers on photonic chip 120), and/or optical proximity communication (such as using reflective mirrors and/or evanescent coupling). In an exemplary embodiment, edge-to-edge coupling is facilitated by using wide optical waveguides in the set of semiconductor optical amplifiers 110 (such as optical waveguides having a width of 2-3 µm), and optical waveguides 124 may have a width of several hundred nanometers.

Using optical path 122-1 as an illustrative example, during operation the tunable wavelength in optical signal 118-1 may be reflected back and forth between reflective coating 116-1 and DBR ring resonator 132-1, which define an optical cavity in optical source 100. This approach may progressively and/or coherently enhance the amplitude of the tunable wavelength in optical signal 118-1 using the multi-pass optical cavity. Therefore, in some embodiments optical source 100 is a laser source with a modulated optical signal. Moreover, because the DBR ring resonators 132 provide a consistent channel spacing, optical paths 122 may be tuned together. For example, a difference between the tunable wavelength and a target wavelength of optical source 100 in a given optical path may be measured so that a magnitude of a static difference in the tunable wavelength can be determined. Then, optional thermal-tuning mechanism 134 may be used to simultaneously tune the tunable wavelengths of DBR ring resonators 132 as a group instead of individually.

While tuning of optical source 100 is illustrated using optional thermal-tuning mechanism 134, more generally a variety of techniques may be used to vary the tunable wavelengths, including changing the effective index of refraction of DBR ring resonators 132 to change the effective optical length (and, thus, the resonant wavelengths). The index of refraction may be changed using: an electro-optical material (such as a liquid crystal), via charge-carrier injection and/or thermal tuning (i.e., changing the temperature of DBR ring resonators 132).

Alternatively or additionally, using one-time 'tuning' the tunable wavelengths can be corrected for an offset from target wavelengths. For example, optical waveguides in DBR ring resonators 132 may be oxidized to permanently fix the static difference. In this way, optional thermal-tuning mechanism 134 may only need to correct changes in the tunable wavelength associated with changes in the ambient temperature or the operating temperature of DBR ring resonators 132.

Note that output optical signals 142 may be extracted or output from optical source 100 in a variety of ways. For example, optical directional couplers (not shown) may be used to control the amount of optical signals 118 that are output in output optical signals 142.

As shown in FIG. 1, optical source 100 may include the optical cavities that hybrid integrate the laser gain medium in the set of semiconductor optical amplifiers 110 and DBR ring resonators 132. However, in general, a wide variety of platforms and integration strategies can be used to implement the optical source. In particular, in addition to the hybrid optical source described previously (with the separate set of semiconductor optical amplifiers 110, which includes a semiconductor other than silicon, and photonic chip 120), in other embodiments the entire optical source is fabricated using a semiconductor material, including the optical gain medium, the optical waveguides, and DBR ring resonators 132. Alternatively, a germanium-based optical gain medium may be included in a silicon-on-insulator platform so that the entire optical source can be fabricated using group IV semiconductors (other than silicon).

In an exemplary embodiment, DBR ring resonator 132-1 includes a single-optical waveguide bus, and a single-ring-resonator geometry as a mirror (thus, DBR ring resonator 132-1 may combine the functions of a DBR and a ring resonator). This DBR ring resonator can eliminate the mode-hopping associated with multiple ring resonances across the optical gain spectrum of a laser. In addition, the use of optional monitor 136 may eliminate optical cavity mode-hopping because of small thermal or environmental changes that shift an adjacent optical cavity mode into optimal alignment within a single ring-resonator resonance and, thus, may prevent the laser from lasing on a new optical mode (such an optical mode-hop may not be acceptable for communications applications). In particular, DBR ring resonator 132-1 may provide a suitable optical monitor or through port that provides information about the alignment of laser-cavity modes within the single resonance reflection peak of DBR ring resonator 132-1, which can be used to align the resonant wavelength of DBR ring resonator 132-1 with the laser-cavity modes and, therefore, can eliminate optical cavity mode-hops. Thus, this additional optical monitor port on DBR ring resonator 132-1 allows the laser output to be separated from optional monitor 136, and allows the optical monitor port to have an output coupling ratio that operates the laser at peak efficiency.

Note that the alignment of DBR ring resonator 132-1 mirror and the resonance or tunable wavelength of DBR ring resonator 132-1 may be independent of the effective size of the ring in DBR ring resonator 132-1, and, thus, the property of the single-narrowband filter may be maintained as the ring resonator in DBR ring resonator 132-1 is tuned. Moreover, in some embodiments the tuning efficiency of DBR ring resonator 132-1 is improved by removing the substrate (such as substrate 314 in FIG. 3) of the ring in DBR ring resonator 132-1, thereby increasing the thermal impedance of DBR ring resonator 132-1.

While FIGS. 1 and 2 show circular DBR ring resonators 132, in other embodiments different configurations or architectures are used, such as a racetrack resonator ring, which includes straight and curved sections. Furthermore, in some embodiments the optical coupling to DBR ring resonators 132 is via a bent optical waveguide bus that is concentric with the ring in DBR ring resonators 132, which may improve repeatability of the bus-to-ring coupling. In addition, this configuration may increase the interaction length of the optical coupling to DBR ring resonators 132.

Note that as long as appropriate optical coupling coefficients are selected for the ring in DBR ring resonators 132, and the DBR grating strength in DBR ring resonators 132 is appropriately small when the physical ratio of the DBR section to ring circumference is maintained (e.g., at 50% or 100%), cancellation of all other ring-resonance peaks may be assured. Thus, DBR ring resonators 132 can replace both the ring-mirror element and the directional optical coupler element in hybrid semiconductor/silicon lasers, while providing tunable mirrors with single optical monitor ports (as opposed to two unbalanced outputs) that may be critically coupled to DBR ring resonators 132 to enhance laser monitoring and feedback. Moreover, DBR ring resonators 132 may have single, tunable wavelength selection based on the resonance wavelength (as opposed to reflecting every free-spectral range or FSR of the ring resonator, which may force the design to very small and fabrication-insensitive ring resonators), and may have a more compact design. For example, the common radius of circular DBR ring resonators 132 may be between 5-30 µm.

DBR ring-resonator mirrors may have a single, narrow reflection peak because the resonant nature of a ring resonator may effectively provide a longer DBR, while maintaining the compact size of the ring resonator. Moreover, co-locating the ring resonator and the DBR in a single component may provide efficient tuning, because the ring resonantor and the grating may provide coarse and fine filtering. The use of separate output optical waveguides (and, thus, drop ports) from the optical monitor ports may reduce the power sent to the optical monitor ports and (as noted previously) may allow the output coupling to be selected for the highest efficiency laser operation. In the context of a hybrid external cavity laser, DBR ring resonators 132 may provide simple, compact, and low-power components that tune the lasing wavelengths without suffering from laser mode-hops resulting from competing ring-resonance peaks when the FSRs of the ring resonators are smaller than the optical gain bandwidth.

In an exemplary embodiment, the optical source locks the channel spacing of a WDM laser array to a fixed spacing. This may eliminate the usual variation of up to 5 nm from device to device that can occur in a laser array. In particular, an array of DBR ring resonators in close proximity with the common (or same) radius may have variations in channel spacing of less than or equal to 0.1 nm. Moreover, the DBR ring resonators may provide separate optical monitor ports that can be used to align the resonance wavelengths of the DBR ring resonators to the laser-cavity modes, and the output coupling ratios for these optical monitor ports can be designed to operate the laser array at peak efficiency. Furthermore, by implementing a DBR inside a ring resonator, both wavelength-selective elements experience the same fabrication variation so they will still be aligned, and this single element can be tuned as one rather than with individual tuners for the DBR and the ring resonator. In addition, when the DBR is mapped onto the curvature of the ring resonator, the phase errors of snapping the grating to a reticle grid are evenly distributed.

Figure 4:
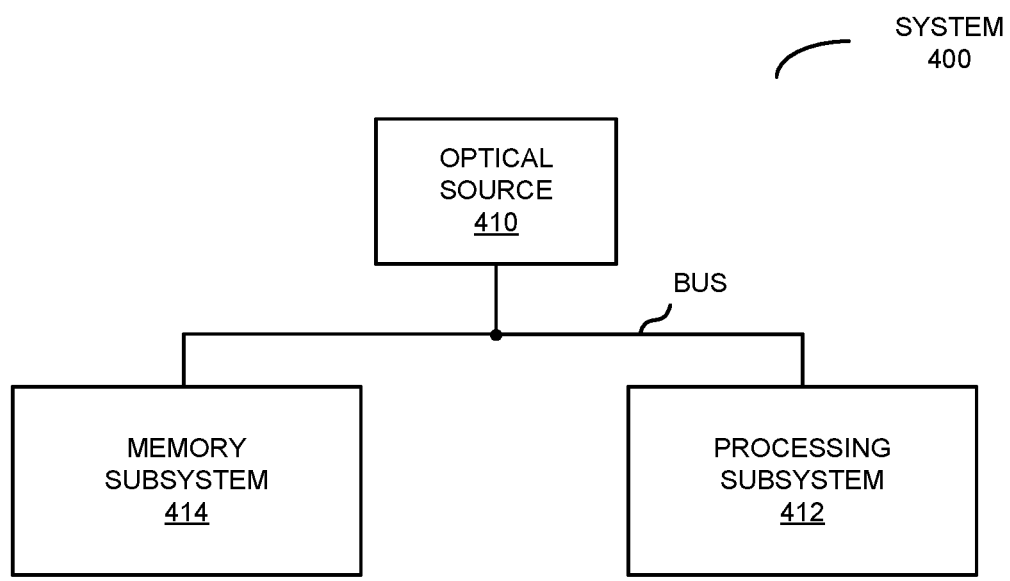
FIG. 4 is a block diagram illustrating a system that includes an optical source in accordance with an embodiment of the present disclosure.

One or more of the preceding embodiments of the optical source may be included in a system and/or an electronic device. This is shown in FIG. 4, which presents a block diagram illustrating a system 400 that includes optical source 410, such as one of the preceding embodiments of the optical source. In some embodiments, system 400 includes processing subsystem 412 (with one or more processors) and memory subsystem 414 (with memory).

In general, functions of optical source 410 and system 400 may be implemented in hardware and/or in software. Thus, system 400 may include one or more program modules or sets of instructions stored in a memory subsystem 414 (such as DRAM or another type of volatile or non-volatile computer-readable memory), which, during operation, may be executed by a processing subsystem 412. Note that the one or more computer programs may constitute a computer-program mechanism. Furthermore, instructions in the various modules in memory subsystem 414 may be implemented in: a high-level procedural language, an object-oriented programming language, and/or in an assembly or machine language. Note that the programming language may be compiled or interpreted, e.g., configurable or configured, to be executed by the processing subsystem.

Components in system 400 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 400 may be at one location or may be distributed over multiple, geographically dispersed locations.

System 400 may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 410 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Furthermore, the embodiments of optical source 410 and/or system 400 may include fewer components or additional components. For example, semiconductor substrate 314 (FIG. 3) may be one of multiple substrates in a multi-chip module (such as a multi-chip module in which alternating facing chips that include routing and bridge layers are coupled using optical proximity communication). Furthermore, a wide variety of fabrication techniques may be used to fabricate the optical source in the preceding embodiments of the optical source, as is known to one of skill in the art. For example, instead of flip-chip or wafer bonding, semiconductor optical amplifiers 110 (FIG. 1) may be monolithically integrated onto a silicon-on-insulator substrate by epitaxial growth or using another fabrication technique. In addition, a wide variety of optical components may be used in or in conjunction with the optical source. In some embodiments the DBR ring resonators are replaced with photonic crystal resonators.

Although these embodiments are illustrated as having a number of discrete items, these optical components, integrated circuits and the system are intended to be functional descriptions of the various features that may be present rather than structural schematics of the embodiments described herein.

Consequently, in these embodiments two or more components may be combined into a single component, and/or a position of one or more components may be changed. In addition, functionality in the preceding embodiments of the optical source, optical source 410 and/or system 400 may be implemented more in hardware and less in software, or less in hardware and more in software, as is known in the art.

While the preceding embodiments have been illustrated with particular elements and compounds, a wide variety of materials and compositions (including stoichiometric and non-stoichiometric compositions) may be used, as is known to one of skill in the art. Thus, while a silicon optical waveguide was illustrated in the preceding embodiments, the communication technique may be used with other materials (such as germanium and/or silicon germanium), as is known to one of skill in the art. Moreover, the semiconductor layer may include polysilicon or amorphous silicon. Furthermore, the materials and compounds in optical source 410 may be fabricated using a wide variety of processing techniques, including: evaporation, sputtering, chemical vapor deposition, molecular-beam epitaxy, wet or dry etching (such as photolithography or direct-write lithography), polishing, etc. In addition, a wide variety of optical components may be used in or in conjunction with the optical device and/or optical source 410.

Figure 5:
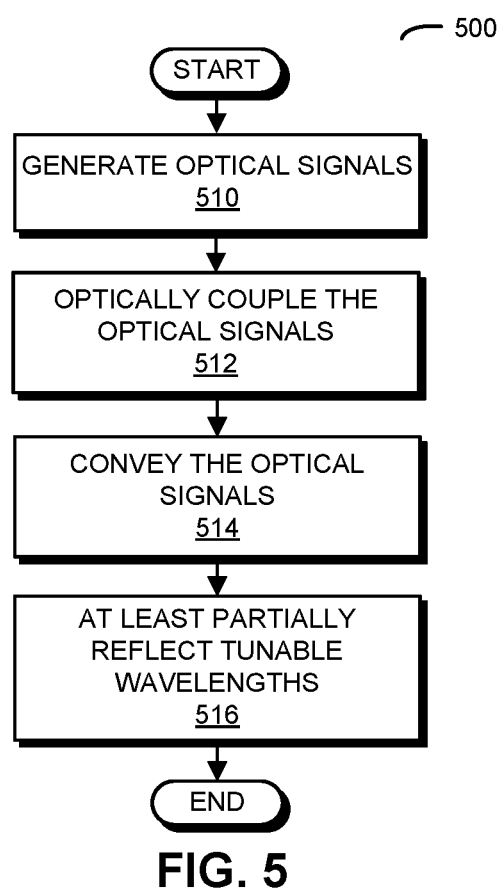
FIG. 5 is a flow chart illustrating a method for providing optical signals in accordance with an embodiment of the present disclosure.

We now describe embodiments of a method for providing optical signals. FIG. 5 presents a flow chart illustrating a method 500 for providing optical signals, which may be performed by an embodiment of the optical source. During operation, a set of semiconductor optical amplifiers, which are defined in a semiconductor other than silicon, generates optical signals (operation 510), where a given optical signal has a given carrier wavelength. Then, at least portions of the optical signals are optically coupled (operation 512) to different optical paths in a photonic chip. Moreover, optical waveguides in the different optical paths in the photonic chip convey (operation 514) at least the portions of the optical signals, where a given optical waveguide conveys the given optical signal. Next, DBR ring resonators, which are optically coupled to the optical waveguides, at least partially reflect (operation 516) tunable wavelengths in the optical signals, where a given DBR ring resonator includes a different number of grating periods than the DBR ring resonators in the remaining optical paths, and where the DBR ring resonators in the optical paths have a common radius.

In some embodiments of method 500, there may be additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An optical source, comprising:
   a set of semiconductor optical amplifiers defined in a semiconductor other than silicon, wherein a given semiconductor optical amplifier has a first edge and a second edge, includes a reflective coating on the first edge, and, during operation, provides a given optical signal having a given carrier wavelength at the second edge; and
   a photonic chip optically coupled to the set of semiconductor optical amplifiers, wherein the photonic chip includes optical paths and a given optical path includes:
      an optical waveguide that conveys the given optical signal, wherein the optical waveguide has a third edge optically coupled to the second edge and a fourth edge; and
      a distributed-Bragg-reflector (DBR) ring resonator, optically coupled to the optical waveguide proximate to the fourth edge, that, during operation, at least partially reflects a given tunable wavelength in the given optical signal, wherein the DBR ring resonator includes a different number of grating periods than DBR ring resonators in the remaining optical paths; and
      wherein the DBR ring resonators in the optical paths have a common radius.

2. The optical source of claim 1, wherein the set of semiconductor optical amplifiers is one of: edge coupled to the photonic chip; and surface-normal coupled to the photonic chip.

3. The optical source of claim 1, wherein the given optical path further comprises an output optical waveguide optically coupled to the optical waveguide between the third edge and the fourth edge.

4. The optical source of claim 1, wherein the optical source further comprises a combiner that combines optical signals from the optical paths into a common output optical signal having multiple tunable wavelengths.

5. The optical source of claim 1, further comprising:
   a thermal-tuning mechanism thermally coupled to the DBR ring resonators;
   a monitor, optically coupled to the at least one of the optical paths, that, during operation, measures at least one of the tunable wavelengths; and
   control logic, electrically coupled to the monitor and the thermal-tuning mechanism, that, during operation, thermally tunes tunable wavelengths of the DBR ring resonators based on the measurement of at least the one of the tunable wavelengths, wherein the DBR ring resonators are thermally tuned as a group instead of being individually tuned.

6. The optical source of claim 1, wherein the control logic is configured to monitor the optical power of the DBR ring resonators using the thermal-tuning mechanism.

7. The optical source of claim 1, wherein grating-waveguide perturbations fill one of: 50% of a total circumference of the ring, and 100% of a total circumference of the ring.

8. The optical source of claim 1, wherein adjacent DBR ring resonators have an integer difference in the number of grating periods.

9. The optical source of claim 1, wherein the given optical path further comprises a phase modulator optically coupled to the optical waveguide.

10. The optical source of claim 1, wherein the photonic chip includes:
    a substrate;
    a buried-oxide layer disposed on the substrate; and
    a semiconductor layer disposed on the buried-oxide layer, wherein the optical paths and the DBR ring resonators are defined in the semiconductor layer.

11. The optical source of claim 10, wherein the substrate, the buried-oxide layer and the semiconductor layer constitute a silicon-on-insulator technology.

12. A system, comprising:
    a processor;
    a memory coupled to the processor; and
    an optical source, wherein the optical source includes:
       a set of semiconductor optical amplifiers defined in a semiconductor other than silicon, wherein a given semiconductor optical amplifier has a first edge and a second edge, includes a reflective coating on the first edge, and, during operation, provides a given optical signal having a given carrier wavelength at the second edge; and
       a photonic chip optically coupled to the set of semiconductor optical amplifiers, wherein the photonic chip includes optical paths and a given optical path includes:
          an optical waveguide that conveys the given optical signal, wherein the optical waveguide has a third edge optically coupled to the second edge and a fourth edge; and
          a distributed-Bragg-reflector (DBR) ring resonator, optically coupled to the optical waveguide proximate to the fourth edge, that, during operation, at least partially reflects a given tunable wavelength in the given optical signal, wherein the DBR ring resonator includes a different number of grating periods than DBR ring resonators in the remaining optical paths; and
          wherein the DBR ring resonators in the optical paths have a common radius.

13. The system of claim 12, wherein the set of semiconductor optical amplifiers is one of: edge coupled to the photonic chip; and surface-normal coupled to the photonic chip.

14. The system of claim 12, wherein the given optical path further comprises an output optical waveguide optically coupled to the optical waveguide between the third edge and the fourth edge.

15. The system of claim 12, wherein the optical source further comprises a combiner that combines optical signals from the optical paths into a common output optical signal having multiple tunable wavelengths.

16. The system of claim 12, wherein the optical source further comprises:
- a thermal-tuning mechanism thermally coupled to the DBR ring resonators;
- a monitor, optically coupled to the at least one of the optical paths, that, during operation, measures at least one of the tunable wavelengths; and
- control logic, electrically coupled to the monitor and the thermal-tuning mechanism, that, during operation, thermally tunes tunable wavelengths of the DBR ring resonators based on the measurement of at least the one of the tunable wavelengths, wherein the DBR ring resonators are thermally tuned as a group instead of being individually tuned.

17. The system of claim 12, wherein grating-waveguide perturbations fill one of: 50% of a total circumference of the ring, and 100% of a total circumference of the ring.

18. The system of claim 12, wherein adjacent DBR ring resonators have an integer difference in the number of grating periods.

19. The system of claim 12, wherein the given optical path further comprises a phase modulator optically coupled to the optical waveguide.

20. A method for providing optical signals, the method comprising:
- generating optical signals in a set of semiconductor optical amplifiers defined in a semiconductor other than silicon, wherein a given optical signal has a given carrier wavelength;
- optically coupling at least portions of the optical signals to different optical paths in a photonic chip;
- conveying at least the portions of the optical signals in the photonic chip in optical waveguides in the different optical paths, wherein a given optical waveguide conveys the given optical signal; and
- at least partially reflecting tunable wavelengths in the optical signals using distributed-Bragg-reflector (DBR) ring resonators that are optically coupled to the optical waveguides, wherein a given DBR ring resonator includes a different number of grating periods than the DBR ring resonators in the remaining optical paths; and
- wherein the DBR ring resonators in the optical paths have a common radius.

* * * * *

UNITED STATES PATENT AND TRADEMARK OFFICE
CERTIFICATE OF CORRECTION

| | | |
|---|---|---|
| PATENT NO. | : 10,014,659 B2 | Page 1 of 1 |
| APPLICATION NO. | : 15/183559 | |
| DATED | : July 3, 2018 | |
| INVENTOR(S) | : Bovington et al. | |

It is certified that error appears in the above-identified patent and that said Letters Patent is hereby corrected as shown below:

In the Specification

Column 3, Line 66, after "in a" insert -- III-V --.

Column 4, Line 10, after "the" insert -- III-V --.

Column 6, Lines 14-24, Delete "coupling (such as facet-to-facet optical coupling), vertical or surface-normal coupling (such as a vertical-angled technique using an angled-facet output on the set of semiconductor optical amplifiers 110, and grating couplers on photonic chip 120), and/or optical proximity communication (such as using reflective mirrors and/or evanescent coupling). In an exemplary embodiment, edge-to-edge coupling is facilitated by using wide optical waveguides in the set of semiconductor optical amplifiers 110 (such as optical waveguides having a width of 2-3 μm), and optical waveguides 124 may have a width of several hundred nanometers." and insert the same on Column 6, Line 13, as a continuation of the same paragraph.

Column 7, Line 11, after "a" insert -- III-V --.

Column 8, Line 4, after "hybrid" insert -- III-V --.

Column 8, Line 22, after "resonantor" insert -- resonator --.

Signed and Sealed this
Second Day of April, 2019

Andrei Iancu
*Director of the United States Patent and Trademark Office*